(12) United States Patent
Sun (10) Patent No.: US 11,222,888 B2
(45) Date of Patent: Jan. 11, 2022

(54) ANTI-STATIC METAL OXIDE SEMICONDUCTOR FIELD EFFECT TRANSISTOR STRUCTURE

(71) Applicant: CSMC TECHNOLOGIES FAB2 CO., LTD., Jiangsu (CN)

(72) Inventor: Jun Sun, Wuxi (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 16/980,368

(22) PCT Filed: Mar. 5, 2019

(86) PCT No.: PCT/CN2019/077018
§ 371 (c)(1),
(2) Date: Sep. 11, 2020

(87) PCT Pub. No.: WO2019/174495
PCT Pub. Date: Sep. 19, 2019

(65) Prior Publication Data
US 2021/0043623 A1     Feb. 11, 2021

(30) Foreign Application Priority Data

Mar. 13, 2018 (CN) .......................... 201810204910.X (51) Int. Cl.
*H01L 23/62* (2006.01)
*H01L 27/02* (2006.01)
(Continued)

(52) U.S. Cl.
CPC .......... *H01L 27/0266* (2013.01); *H01L 23/60* (2013.01); *H01L 27/0255* (2013.01);
(Continued)

(58) Field of Classification Search
CPC ............. H01L 27/0727; H01L 29/0847; H01L 29/7816; H01L 29/742; H01L 29/7436;
(Continued)

(56) References Cited

U.S. PATENT DOCUMENTS 6,756,642 B2    6/2004  Lee et al.
8,530,931 B2 *  9/2013  Asano ................. H01L 27/0262
                                                      257/173
(Continued)

FOREIGN PATENT DOCUMENTS

CN        101202279 A     6/2008
CN        100563007 C    11/2009
(Continued)

OTHER PUBLICATIONS

International Search Report, dated Jun. 6, 2019 for corresponding International Application No. PCT/CN2019/077018 with English translation.

(Continued)

*Primary Examiner* — Shouxiang Hu
(74) *Attorney, Agent, or Firm* — Intellectual Property Law Group LLP (57) ABSTRACT

An anti-static metal oxide semiconductor field effect transistor structure includes an anti-static body structure and a slave metal oxide semiconductor field effect transistor, the anti-static body structure includes: a main metal oxide semiconductor field effect transistor; a first silicon controlled rectifier, an anode thereof being connected to a drain of the main metal oxide semiconductor field effect transistor, a cathode and a control electrode thereof being connected to a source of the main metal oxide semiconductor field effect transistor; and a second silicon controlled rectifier, an anode thereof being connected to the drain of the main metal oxide semiconductor field effect transistor, a cathode thereof being (Continued)

connected to a gate of the main metal oxide semiconductor field effect transistor, a control electrode thereof being connected to the source or the gate of the main metal oxide semiconductor field effect transistor.

20 Claims, 7 Drawing Sheets (51) Int. Cl.
*H01L 27/07* (2006.01)
*H01L 29/08* (2006.01)
*H01L 29/78* (2006.01)
*H01L 23/60* (2006.01)
*H01L 29/87* (2006.01)

(52) U.S. Cl.
CPC ...... *H01L 27/0727* (2013.01); *H01L 29/0847* (2013.01); *H01L 29/7816* (2013.01); *H01L 29/87* (2013.01)

(58) Field of Classification Search
CPC ............ H01L 29/7818; H01L 29/0696; H01L 29/42368; H01L 27/0705; H01L 27/0262; H01L 27/02; H01L 29/87; H01L 27/0266; H01L 27/0255; H01L 23/60; H01L 29/0626; H01L 27/0259; H01L 27/0277; H01L 27/0647; H01L 29/0834; H01L 27/0296; H01L 27/0623; H01L 27/0635; H01L 29/66393

See application file for complete search history.

(56) References Cited

U.S. PATENT DOCUMENTS

| | | | |
|---|---|---|---|
| 2004/0089909 | A1 | 3/2004 | Lee et al. |
| 2006/0043487 | A1* | 3/2006 | Pauletti ................ H01L 29/87 |
| | | | 257/355 |
| 2012/0305984 | A1* | 12/2012 | Campi, Jr. ............ H01L 29/742 |
| | | | 257/124 |
| 2013/0285113 | A1* | 10/2013 | Edwards ............. H01L 27/0262 |
| | | | 257/133 |
| 2018/0012961 | A1* | 1/2018 | Aharoni .............. H01L 27/0266 |

FOREIGN PATENT DOCUMENTS

| | | |
|---|---|---|
| CN | 102110686 A | 6/2011 |
| CN | 202384340 U | 8/2012 |
| CN | 106876473 A | 6/2017 |

OTHER PUBLICATIONS

Written Opinion of the ISA, dated Jun. 2, 2019 for corresponding International Application No. PCT/CN2019/077018.
China Office Action, dated Apr. 8, 2020, for corresponding China Application No. 201810204910.X with English translation.

* cited by examiner

ANTI-STATIC METAL OXIDE SEMICONDUCTOR FIELD EFFECT TRANSISTOR STRUCTURE

CROSS-REFERENCE TO RELATED APPLICATIONS

The present application is a national stage of International Application No. PCT/CN2019/077018 filed on Mar. 5, 2019, which claims priority to Chinese patent application No. 201810204910X, filed on Mar. 13, 2018. Both applications are incorporated herein by reference in their entireties.

TECHNICAL FIELD

The present disclosure relates to an anti-static protection apparatus, and more particularly relates to an anti-static metal oxide semiconductor field effect transistor structure.

BACKGROUND

Electrostatic discharge is a common natural phenomenon in our lives, but a large current generated in a short time during electrostatic discharge will cause fatal damage to integrated circuits, which is an important problem that causes failure in the production and application of integrated circuits.

A conventional electrostatic discharge (ESD) protection structure mainly considers the ESD characteristics and ignores the characteristics of the device itself. For example, a Chinese patent application with an application no. CN201710272821.4 may increase a holding current of the device and replace the increase of a holding voltage of the device to a certain extent, but its own characteristics as an LDMOS device will be weakened (e.g., the Breakdown Voltage BV will be reduced).

SUMMARY

Therefore, it is necessary to provide a new-type anti-static metal oxide semiconductor field effect transistor structure.

An anti-static metal oxide semiconductor field effect transistor structure, including an anti-static body structure and a slave metal oxide semiconductor field effect transistor, the anti-static body structure including: a main metal oxide semiconductor field effect transistor; a first silicon controlled rectifier, an anode of the first silicon controlled rectifier being connected to a drain of the main metal oxide semiconductor field effect transistor, a cathode and a control electrode of the first silicon controlled rectifier being connected to a source of the main metal oxide semiconductor field effect transistor; a second silicon controlled rectifier, an anode of the second silicon controlled rectifier being connected to the drain of the main metal oxide semiconductor field effect transistor, a cathode of the second silicon controlled rectifier being connected to a gate of the main metal oxide semiconductor field effect transistor, a control electrode of the second silicon controlled rectifier being connected to the source or the gate of the main metal oxide semiconductor field effect transistor.

In the anti-static metal oxide semiconductor field effect transistor structure described above, the silicon controlled rectifier is also integrated as an ESD protection design from the drain terminal to the gate terminal of the main metal oxide semiconductor field effect transistor M1. Compared with the conventional technology of integrating an ESD protection structure only between the drain terminal and the source terminal, it may prevent a coupling voltage between the drain terminal and the gate terminal from breaking down the gate oxide upon the arrival of an ESD stress, so that a higher ESD protection capability may be obtained.

DETAILED DESCRIPTION OF THE EMBODIMENTS

In order to facilitate understanding of the present disclosure, the present disclosure will be more fully described with reference to the relate drawings below. Preferred embodiments of the present disclosure are shown in the drawings. However, the present disclosure may be implemented in many different forms and is not limited to the embodiments described herein. Conversely, the purpose of providing these embodiments is to make the content of the present disclosure more thorough and comprehensive.

Unless otherwise defined, all technical and scientific terminologies used herein have the same meaning as generally understood by those skilled in the art belonging to the present disclosure. The terminologies used herein in the specification of the present disclosure are only for the purpose of describing specific embodiments, and not intended to limit the present disclosure. The terminologies "and/or" used herein include any and all combinations of one or more related listed items.

The vocabulary in the semiconductor field used herein is a technical vocabulary commonly used by those skilled in the art. For example, for P type impurity and N type impurity, in order to distinguish doping concentration, it is simple to use P+ type to represent P type of heavy doping concentration, use P type to represent P type of medium doping concentration, use P− type to represent P type of light doping concentration, use N+ type to represent N type of the heavy doping concentration, use N type to represent N type of the medium doping concentration, and use N− type to represent N type of the light doping concentration.

Figure 1:
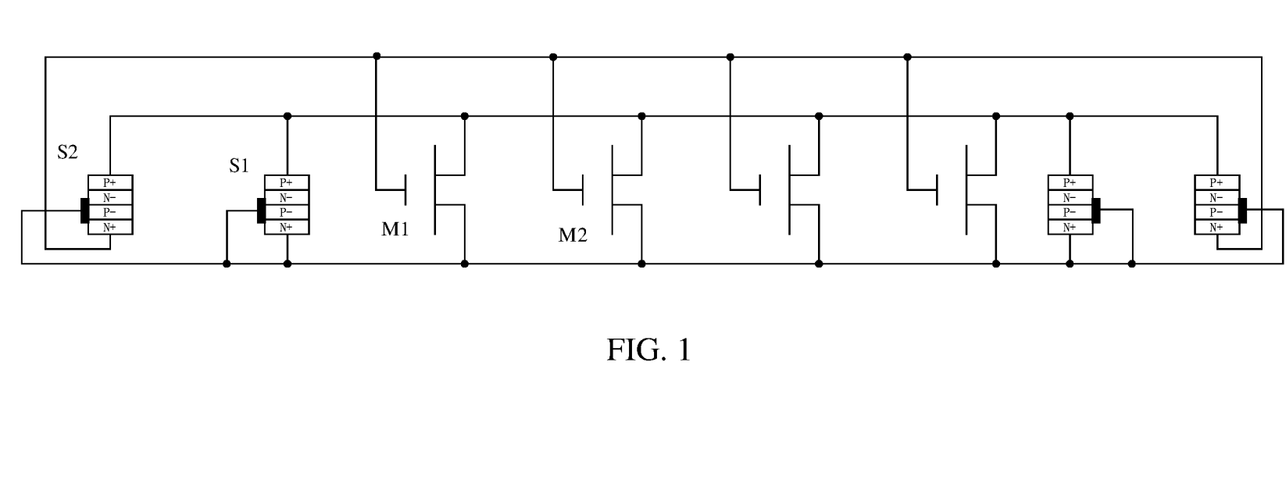
FIG. 1 is a circuit schematic diagram of an anti-static metal oxide semiconductor field effect transistor structure in an embodiment.

FIG. 1 is a circuit schematic diagram of an anti-static metal oxide semiconductor field effect transistor structure in an embodiment. The anti-static metal oxide semiconductor field effect transistor structure includes an anti-static body structure and a slave metal oxide semiconductor field effect transistor M2. The anti-static body structure includes a metal oxide semiconductor field effect transistor M1, a first silicon controlled rectifier (SCR) S1 and a second silicon controlled rectifier S2. In the embodiment shown in FIG. 1, the anti-static metal oxide semiconductor field effect transistor structure is an axisymmetric structure, and two anti-static body structures are symmetrical with respect to a centerline of the anti-static metal oxide semiconductor field effect transistor structure. Thus, only the components and parts on one side of the symmetry axis are indicated in FIG. 1.

In the embodiment shown in FIG. 1, an anode of the first silicon controlled rectifier S1 is connected to a drain of the main metal oxide semiconductor field effect transistor M1, and a cathode and a control electrode of the first silicon controlled rectifier S1 are connected to a source of the main metal oxide semiconductor field effect transistor M1.

An anode of the second silicon controlled rectifier S2 is connected to the drain of the main metal oxide semiconductor field effect transistor M1, a cathode of the second silicon controlled rectifier S2 is connected to a gate of the main metal oxide semiconductor field effect transistor M1, and a control electrode of the second silicon controlled rectifier S2 is connected to the source of the main metal oxide semiconductor field effect transistor M1.

Figure 2A:
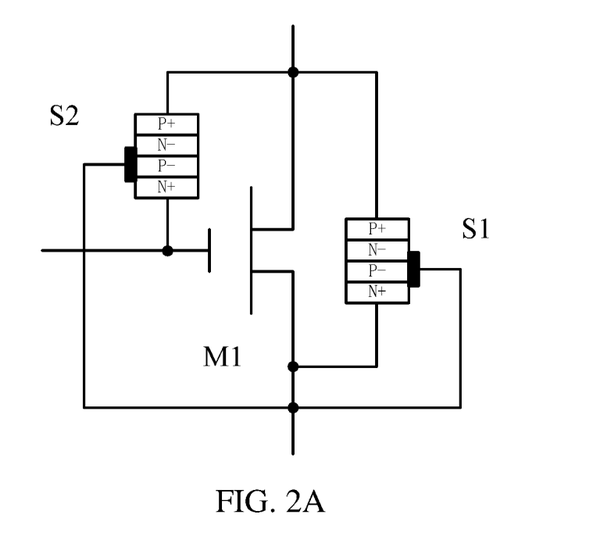
FIG. 2A is a simplified schematic diagram of an anti-static body structure in FIG. 1.
Figure 2B:
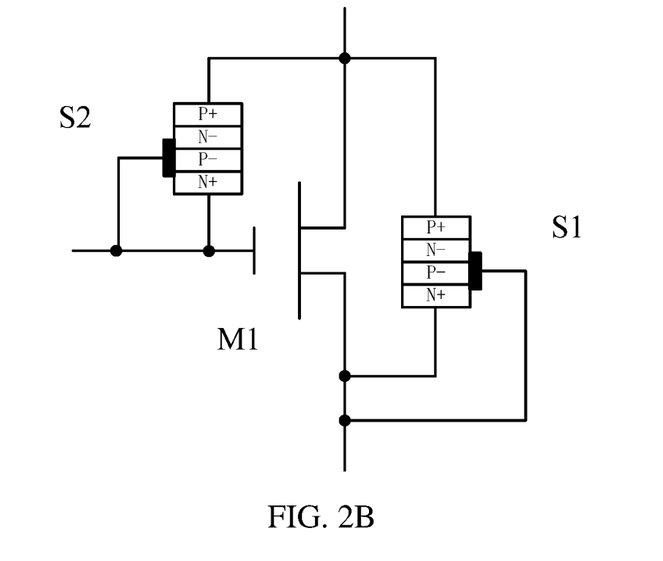
FIG. 2B is a simplified schematic diagram of an anti-static body structure in another embodiment.

FIG. 2A is a simplified schematic diagram of the anti-static body structure in FIG. 1. FIG. 2B is a simplified schematic diagram of an anti-static body structure in another embodiment, which differs from the embodiment shown in FIG. 2a in that the control electrode of the second silicon controlled rectifier S2 is connected to the gate of the main metal oxide semiconductor field effect transistor M1.

In the anti-static metal oxide semiconductor field effect transistor structure described above, the silicon controlled rectifier is also integrated as an ESD protection design from the drain terminal to the gate terminal of the main metal oxide semiconductor field effect transistor M1. Compared with the conventional technology of integrating an ESD protection structure only between the drain terminal and the source terminal, it may prevent a coupling voltage between the drain terminal and the gate terminal from breaking down the gate oxide upon the arrival of an ESD stress, so that a higher ESD protection capability may be obtained.

In the embodiment shown in FIG. 2B, the control electrode of the parasitic silicon controlled rectifier S2 is at the same potential as the gate of the main metal oxide semiconductor field effect transistor M1. For the embodiment shown in FIG. 2A, when there is a coupling potential on the gate of the main metal oxide semiconductor field effect transistor M1, the main metal oxide semiconductor field effect transistor M1 may be in a weak turning-on state. Thus, the parasitic silicon controlled rectifier S2 from the drain terminal to the source terminal has no protection effect, and the ESD stress can be released from the main metal oxide semiconductor field effect transistor M1, thereby damaging the main metal oxide semiconductor field effect transistor M1. However, when the control electrode of the silicon controlled rectifier S2 is connected to the gate of the main metal oxide semiconductor field effect transistor M1, the silicon controlled rectifier S2 may also be turned on to release the ESD stress. In this way, the main metal oxide semiconductor field effect transistor M1 itself can be better protected, thereby improving the ESD protection capability of the main metal oxide semiconductor field effect transistor M1.

In one of the embodiments, the main metal oxide semiconductor field effect transistor M1 and the slave metal oxide semiconductor field effect transistor M2 are Laterally Diffused Metal Oxide Semiconductor Field Effect Transistors (LDMOSFETs).

In one of the embodiments, the first silicon controlled rectifier S1 and the second silicon controlled rectifier S2 are SCR-LDMOSFETs.

Figure 3:
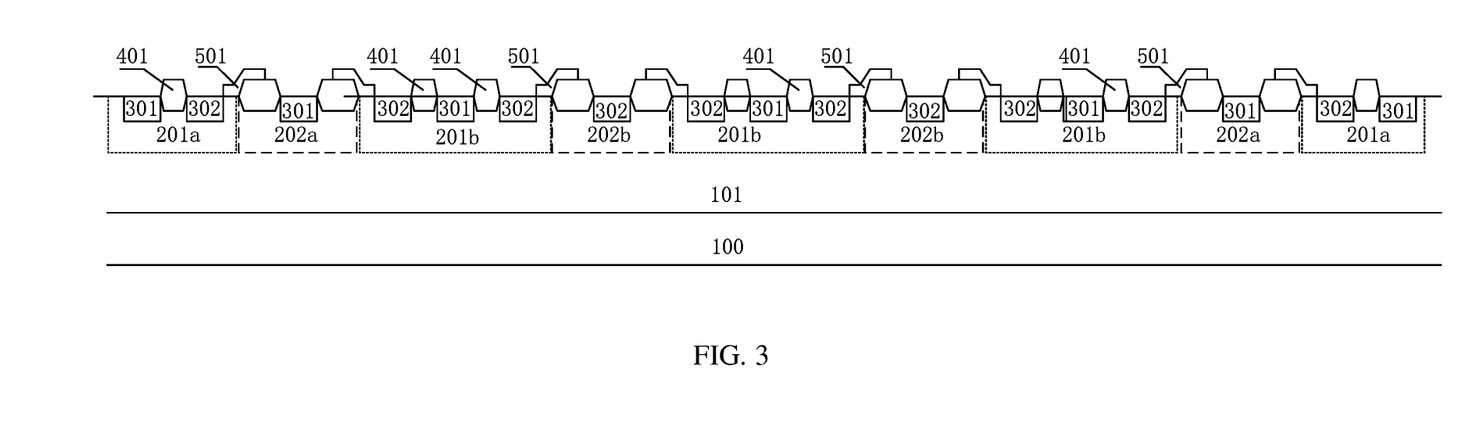
FIG. 3 is a cross-sectional schematic diagram of an anti-static metal oxide semiconductor field effect transistor structure in an embodiment.

FIG. 3 is a cross-sectional schematic diagram of an anti-static metal oxide semiconductor field effect transistor structure in an embodiment, in which each structure is disposed on a substrate 100, and specifically includes: a first well region 201a, a second well region 201b, a first doping region 202a and a second doping region 202b, wherein the first doping region 202a is located between the first well region 201a and the second well region 201b, and the second well region 201b is located between the first doping region 202a and the second doping region 202b. The first doping region 202a and the second doping region 202b have a first conductivity type. The first well region 201a and the second well region 201b have a second conductivity type. In the embodiment, the first conductivity type is the N type, and the second conductivity type is the P type. In other embodiments, the first conductivity type may be the P type, and the second conductivity type may be the N type.

A first lead-out region 302 is disposed in each of the first well region 201a, the second well region 201b and the second doping region 202b. A second lead-out region 301 is disposed in each of the first doping region 202a and the second well region 201b. The first lead-out region 302 has the first conductivity type, and the second lead-out region 301 has the second conductivity type. Two first lead-out regions 302 are disposed in the second well region 201b, and the second lead-out region 301 in the second well region 201b is located between the two first lead-out regions 302. Polysilicon gates 501 are formed at a boundary of the first well region 201a and the first doping region 202a, a boundary of the first doping region 202a and the second well region 201b, and a boundary of the second well region 201b and the second doping region 202b.

The first lead-out region 302 in the first well region 201a, the first well region 201a, the first doping region 202a and the second lead-out region 301 in the first doping region 202a serve as the second silicon controlled rectifier S2. The second lead-out region 301 in the first doping region 202a serves as the anode of the second silicon controlled rectifier S2. The first lead-out region 302 in the first well region 201a serves as the cathode of the second silicon controlled rectifier S2. The polysilicon gate 501 at the boundary of the first well region 201a and the first doping region 202a serves as the control electrode of the second silicon controlled rectifier S2. The second lead-out region 301 in the first doping region 202a, the first doping region 202a, the second well region 201b and the first lead-out region 302 near the first doping region 202a in the second well region 201b server as the first silicon controlled rectifier S1. The second lead-out region 301 in the first doping region 202a serves as the anode of the first silicon controlled rectifier S1 (i.e., the first Silicon controlled rectifier S1 and the second silicon controlled rectifier S2 share the second lead-out region 301 in the first doping region 202a as the anode). The first lead-out region 302 near the first doping region 202a in the second well region 201b serves as the cathode of the first silicon controlled rectifier S1. The polysilicon gate 501 (not indicated in FIG. 3) at the boundary of the second well region 201b and the first doping region 202a serves as the control electrode of the first silicon controlled rectifier S1. The first lead-out region 302 near the second doping region 202b in the second well region 201b serves as the source of the main metal oxide semiconductor field effect transistor M1. The first lead-out region 302 in the second doping region 202b serves as the drain of the main metal oxide semiconductor field effect transistor M1. The polysilicon gate 501 at the boundary of the second well region 201b and the second doping region 202b serves as the gate of the main metal oxide semiconductor field effect transistor M1.

In the embodiment shown in FIG. 3, a third well region 101 is also formed on the substrate 100. The first well region 201a, the second well region 201b, the first doping region 202a and the second doping region 202b are formed in the third well region 101. The doping concentration of the third well region 101 is greater than the doping concentration of the substrate 100. The doping concentrations of the well region 201a and the second well region 201b are greater than the doping concentration of the third well region 101.

Figure 4:
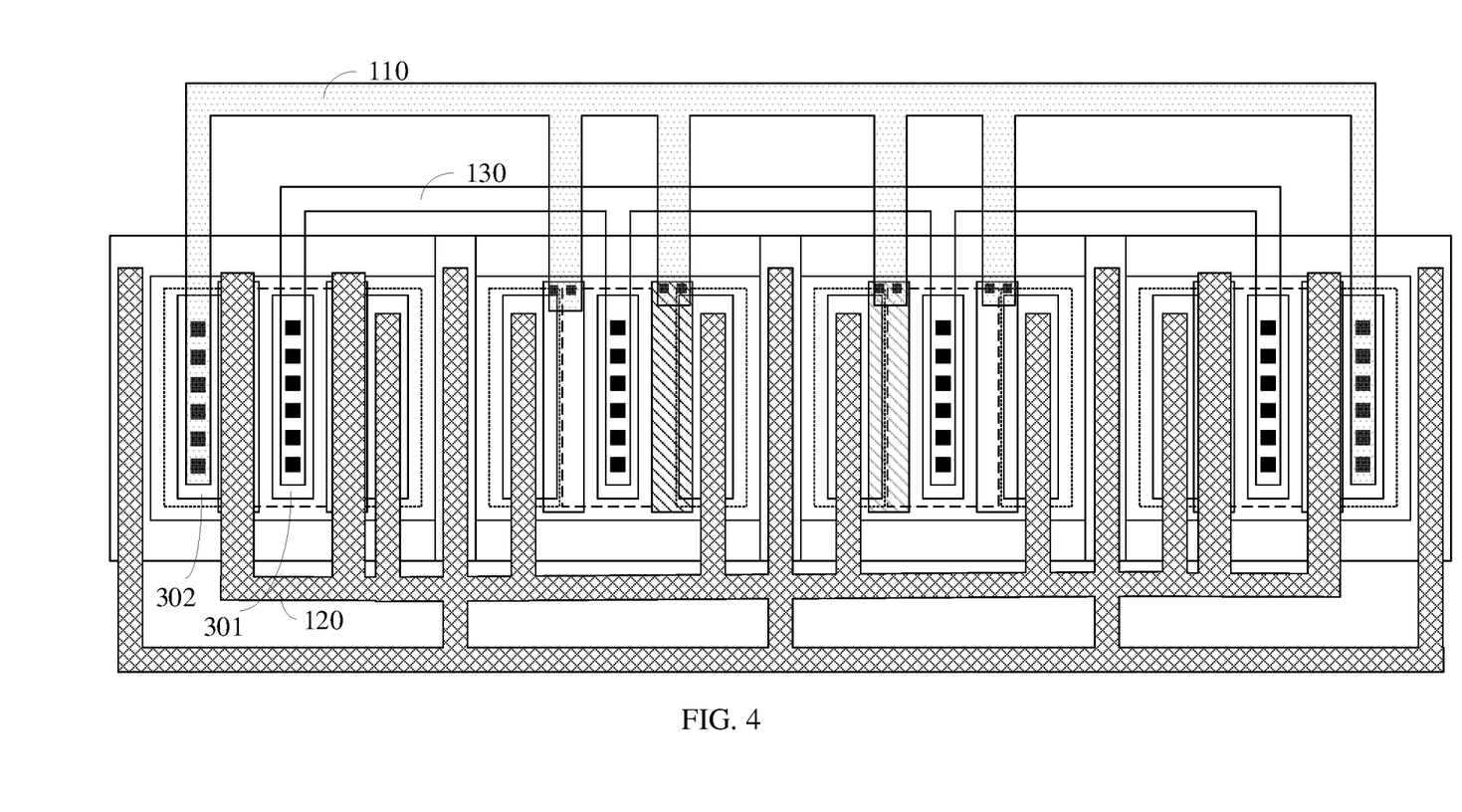
FIG. 4 is a layout of an anti-static metal oxide semiconductor field effect transistor structure in an embodiment.

FIG. 4 is a layout of an anti-static metal oxide semiconductor field effect transistor structure in an embodiment. Please also referring to FIG. 3, the first lead-out region 302 in the first well region 201a is electrically connected to the polysilicon gate 501 at the boundary of the second well region 201b and the second doping region 202b through a first metal wire 110. The polysilicon gates 501 at the boundary of the first doping region 202a and the first well region 201a, the polysilicon gates 501 at the boundary of the first doping region 202a and the second well region 201b, the second lead-out region 301 and two first lead-out regions 302 in the second well region 201b are electrically connected through a second metal wire 120. The second lead-out region 301 in the first doping region 202a and the first lead-out region 302 in the second doping region 202b are electrically connected through a third metal wire 130.

Figure 5:
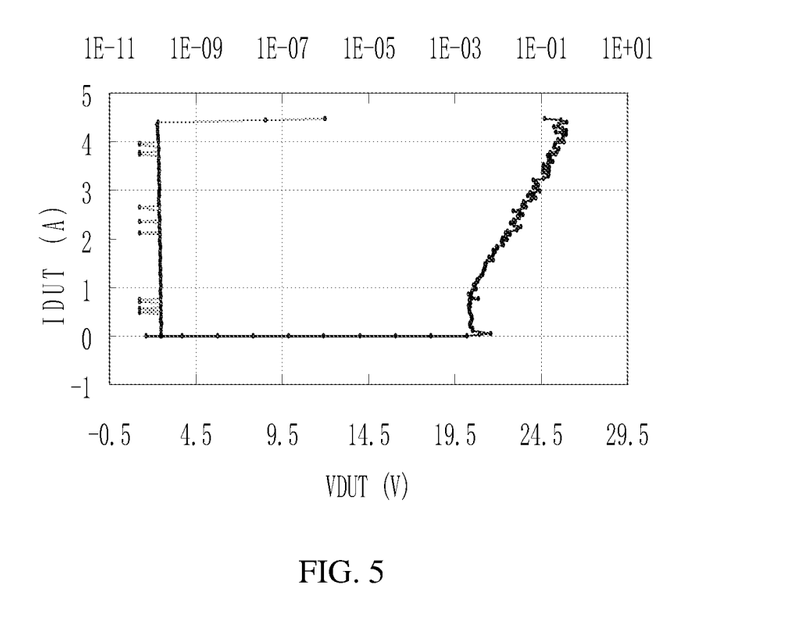
FIG. 5 is a TLP curve diagram of a conventional device with only an ESD protection design itself.
Figure 6:
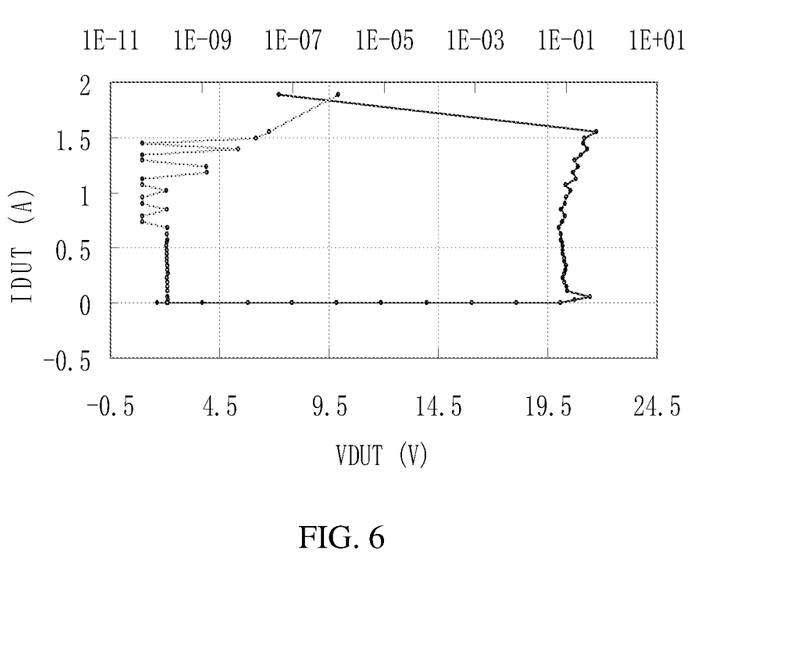
FIG. 6 is a TLP curve diagram of a device with only an ESD protection design from the drain terminal to the source terminal of a LDMOSFET, and without an ESD protection design from the drain terminal to the gate terminal of the LDMOSFET.
Figure 7:
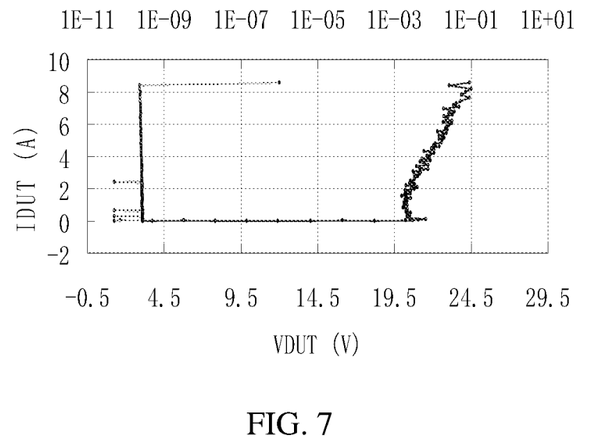
FIG. 7 is a TLP curve diagram of the embodiment with both the ESD protection design from the drain terminal to the source terminal of the LDMOSFET and the ESD protection design from the drain terminal to the gate terminal of the LDMOSFET shown in FIG. 4.

FIG. 5 is a TLP (Transmission Line Pulse) curve diagram of a conventional device with only an ESD protection design itself. FIG. 6 is a TLP curve diagram of a device with only an ESD protection design from the drain terminal to the source terminal of a LDMOSFET, and without an ESD protection design from the drain terminal to the gate terminal of the LDMOSFET. FIG. 7 is a TLP curve diagram of the embodiment with both the ESD protection design from the drain terminal to the source terminal of the LDMOSFET and the ESD protection design from the drain terminal to the gate terminal of the LDMOSFET shown in FIG. 4. In FIGS. 5-7, a lower abscissa is a voltage value VDUT scanned on a device under test, an upper abscissa is a leakage current value (in amperes) of the device under test at a certain fixed voltage, and an ordinate is a current value IDUT that the device under test can bear; the larger the IDUT (also referred to as a TLP current by those skilled in the art) is, the higher the ESD resistance capability of the device is. FIG. 5 is the TLP curve obtained by separately testing the first silicon controlled rectifier S1 (i.e., the first silicon controlled rectifier S1 in FIG. 2A is not connected to other devices such as the main metal oxide semiconductor field effect transistor M1), the TLP current of which is about 4.3 amperes. FIG. 6 is the TLP curve obtained by testing only the main metal oxide semiconductor field effect transistor M1 in FIG. 2A and the first silicon controlled rectifier S1 (i.e., the structure without the second silicon controlled rectifier S2 in FIG. 2A). It should be noted here that the main metal oxide semiconductor field effect transistor M1 has no TLP current capability (i.e., 0A), and after it is connected to the first silicon controlled rectifier S1, its TLP current reaches about 1A which is much higher than 0A. FIG. 7 is the TLP curve obtained by testing the structure shown in FIG. 2A, in which the TLP current is increased to about 8A to better protect the main metal oxide semiconductor field effect transistor M1.

Compared with a conventional layout structure of Fingers LDMOSFET, in the layout structure shown in FIG. 4, it is only necessary to connect the first lead-out region 302 (the source of a LDMOSFET) indicated in FIG. 4 to the gate and change the drain of the LDMOSFET to the second lead-out region 301 (i.e., the second lead-out region 301 indicated in FIG. 4), which is easy to realize. In this structure relative to the conventional layout structure of Fingers LDMOSFET, in addition to losing the device current capability of two Fingers, other basic characteristics of LDMOS are all consistent with conventional LDMOS device characteristics (such as Breakdown Voltage BV, linear region drain current Idlin, saturation region drain current Idsat, etc). However, its ESD protection capability can be greater improved. In the embodiment shown in FIG. 4, the first lead-out region 302 connected to the gate is disposed at the outermost edge of the device; and in other embodiments it may also be disposed at the center of the device.

In the embodiment shown in FIG. 3, the second lead-out region 301 is disposed on one side of the first well region 201a away from the first doping region 202a.

Referring to FIG. 3, in the embodiment, an isolation structure 401 is formed between the second lead-out region 301 and the polysilicon gates 501 on both sides thereof in the first doping region 202a. The isolation structure 401 is formed between the second lead-out region 301 in the second well region 201b and each of the two first lead-out region 302 in the second well region 201b. The isolation structure 401 is formed between the first lead-out region 302 in the second doping region 202b and the polysilicon gate 501 at the boundary of the second well region 201b and the second doping region 202b.

In the embodiment shown in FIG. 3, the isolation structure 401 may be a field oxide layer.

Figure 8:
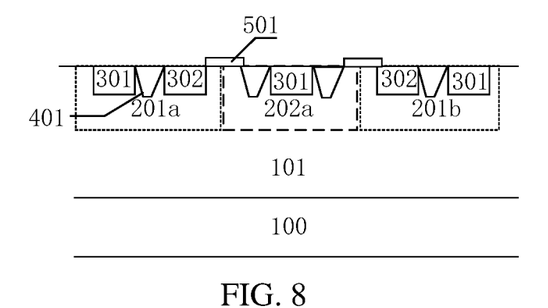
FIG. 8 is a partial cross-sectional schematic diagram of an anti-static metal oxide semiconductor field effect transistor structure in another embodiment.

FIG. 8 is a partial cross-sectional schematic diagram of an anti-static metal oxide semiconductor field effect transistor structure in another embodiment. In the embodiment, the isolation structure 401 is a shallow trench isolation structure (STI).

Figure 9:
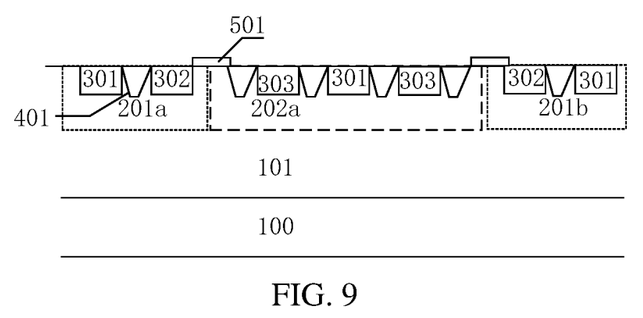
FIG. 9 is a partial cross-sectional schematic diagram of an anti-static metal oxide semiconductor field effect transistor structure in another embodiment.

FIG. 9 is a partial cross-sectional schematic diagram of an anti-static metal oxide semiconductor field effect transistor structure in another embodiment. In the embodiment, third doping regions 303 are further disposed on both sides of the second lead-out region 301 in the first doping region 202a, and the second lead-out region 301 is isolated with these two third doping regions 303 through the isolation structures 401. The two third doping regions 303 have the first conductivity type, and are not led out through a metal conductor.

The capacitance may be reduced by providing the third doping region 303 in the first doping region 202a (equivalent to a diode is connected in series with the drain terminal, so that the parasitic capacitance is reduced). Moreover, the breakdown voltage (BV) of the device can be increased by providing the third doping region 303 with the first conductivity type between the second lead-out region 301 with the second conductivity type and the first well region 201a with the second conductivity type, and between the second lead-out region 301 with the second conductivity type and the second well region 201b with the second conductivity type.

Figure 10:
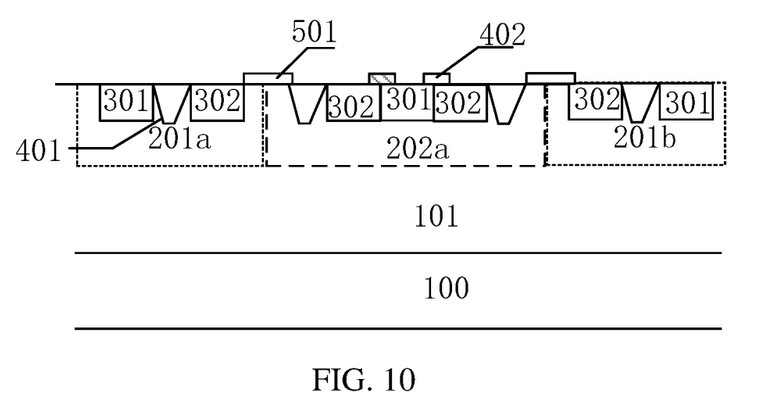
FIG. 10 is a partial cross-sectional schematic diagram of an anti-static metal oxide semiconductor field effect transistor structure in another embodiment.

FIG. 10 is a partial cross-sectional schematic diagram of an anti-static metal oxide semiconductor field effect transistor structure in another embodiment. In the embodiment, a second isolation structure 402 which is different from the isolation structure 402 is used between the second lead-out region 301 and the third doping regions 303 on both sides thereof in the first doping region 202a. In an embodiment of that a process with a line width of 0.5 μm, the second isolation structure 402 is a field oxygen structure; and in an embodiment of that a process with a line width of 0.18 μm, the second isolation structure 402 may be the STI or a salicide block (self-aligned silicified barrier layer).

The above-described embodiments represent only a few implementations of the present disclosure, the description of which is more specific and detailed, but is not therefore to be understood as limiting the patent scope of the present disclosure. It should be noted that several modifications and improvements may be made to those ordinary skilled in the art without departing from the present disclosure concept, all of which fall within the scope of the present disclosure. Therefore, the protection scope of the present disclosure patent shall be subject to the appended claims.

What is claimed is:

1. An anti-static metal oxide semiconductor field effect transistor structure, comprising an anti-static body structure and a slave metal oxide semiconductor field effect transistor, the anti-static body structure comprising:
   a main metal oxide semiconductor field effect transistor;
   a first silicon controlled rectifier, an anode of the first silicon controlled rectifier being connected to a drain of the main metal oxide semiconductor field effect transistor, a cathode and a control electrode of the first silicon controlled rectifier being connected to a source of the main metal oxide semiconductor field effect transistor; and
   a second silicon controlled rectifier, an anode of the second silicon controlled rectifier being connected to the drain of the main metal oxide semiconductor field effect transistor, a cathode of the second silicon controlled rectifier being connected to a gate of the main metal oxide semiconductor field effect transistor, a control electrode of the second silicon controlled rectifier being connected to the source or the gate of the main metal oxide semiconductor field effect transistor.

2. The anti-static metal oxide semiconductor field effect transistor structure according to claim 1, wherein the main metal oxide semiconductor field effect transistor and the slave metal oxide semiconductor field effect transistor are LDMOSFETs.

3. The anti-static metal oxide semiconductor field effect transistor structure according to claim 1, wherein the first silicon controlled rectifier and the second silicon controlled rectifier are SCR-LDMOSFETs.

4. The anti-static metal oxide semiconductor field effect transistor structure according to claim 1, wherein it comprises a first well region, a second well region, a first doping region and a second doping region on a substrate, the first doping region is located between the first well region and the second well region, the second well region is located between the first doping region and the second doping region, the first doping region and the second doping region have a first conductivity type, the first well region and the second well region have a second conductivity type, the first conductivity type is a conductivity type opposite to the second conductivity type; a first lead-out region is disposed in each of the first well region, the second well region and the second doping region, a second lead-out region is disposed in each of the first doping region and the second well region, the first lead-out region has the first conductivity type, the second lead-out region has the second conductivity type, two first lead-out regions are disposed in the second well region, the second lead-out region in the second well region is located between the two first lead-out regions; polysilicon gates are formed at a boundary of the first well region and the first doping region, a boundary of the first doping region and the second well region, and a boundary of the second well region and the second doping region;
   the first lead-out region in the first well region, the first well region, the first doping region and the second lead-out region in the first doping region serve as the second silicon controlled rectifier, the second lead-out region in the first doping region serves as the anode of the second silicon controlled rectifier, the first lead-out region in the first well region serves as the cathode of the second silicon controlled rectifier, the polysilicon gate at the boundary of the first well region and the first doping region serves as the control electrode of the second silicon controlled rectifier; the second lead-out region in the first doping region, the first doping region, the second well region and the first lead-out region near the first doping region in the second well region server as the first silicon controlled rectifier, the second lead-out region in the first doping region serves as the anode of the first silicon controlled rectifier, the first lead-out region near the first doping region in the second well region serves as the cathode of the first silicon controlled rectifier, the polysilicon gate at the boundary of the second well region and the first doping region serves as the control electrode of the first silicon controlled rectifier; the first lead-out region near the second doping region in the second well region serves as the source of the main metal oxide semiconductor field effect transistor, the first lead-out region in the second doping region serves as the drain of the main metal oxide semiconductor field effect transistor, the polysilicon gate at the boundary of the second well region and the second doping region serves as the gate of the main metal oxide semiconductor field effect transistor.

5. The anti-static metal oxide semiconductor field effect transistor structure according to claim 4, wherein the first lead-out region in the first well region is electrically connected to the polysilicon gate at the boundary of the second well region and the second doping region through a first metal wire; the polysilicon gates at the boundary of the first doping region and the first well region are electrically connected through a second metal wire, the polysilicon gates at the boundary of the first doping region and the second well region are electrically connected through the second metal wire, the second lead-out region and two first lead-out regions in the second well region are electrically connected through the second metal wire; the second lead-out region in the first doping region and the first lead-out region in the second doping region are electrically connected through a third metal wire.

6. The anti-static metal oxide semiconductor field effect transistor structure according to claim 4, wherein it comprises two anti-static body structures, and the two anti-static body structures are symmetrical with respect to a centerline of the anti-static metal oxide semiconductor field effect transistor structure.

7. The anti-static metal oxide semiconductor field effect transistor structure according to claim 4, wherein the second lead-out region is further disposed on one side of the first well region away from the first doping region.

8. The anti-static metal oxide semiconductor field effect transistor structure according to claim 4, wherein isolation structures are formed between the second lead-out region and the polysilicon gates on both sides thereof in the first doping region, the isolation structures are formed between the second lead-out region in the second well region and the two first lead-out regions in the second well region.

9. The anti-static metal oxide semiconductor field effect transistor structure according to claim 4, wherein an isolation structure is formed between the first lead-out region in the second doping region and the polysilicon gate at the boundary of the second well region and the second doping region.

10. The anti-static metal oxide semiconductor field effect transistor structure according to claim 8, wherein the isolation structures are shallow trench isolation structures.

11. The anti-static metal oxide semiconductor field effect transistor structure according to claim 8, wherein the isolation structure are formed of a field oxide layer.

12. The anti-static metal oxide semiconductor field effect transistor structure according to claim 8, wherein two third doping regions are further disposed in the first doping region, the second lead-out region in the first doping region is disposed between the two third doping regions and is isolated from the two third doping regions through second isolation structures, a first isolation structure is formed between each of the two third doping regions and its adjacent polysilicon gate, the two third doping regions have the first conductivity type and are not led out through a metal conductor.

13. The anti-static metal oxide semiconductor field effect transistor structure according to claim 12, wherein the second isolation structures are field oxide structures.

14. The anti-static metal oxide semiconductor field effect transistor structure according to claim 12, wherein the second isolation structures are shallow trench isolation structures.

15. The anti-static metal oxide semiconductor field effect transistor structure according to claim 12, wherein the second isolation structures are salicide blocks.

16. The anti-static metal oxide semiconductor field effect transistor structure according to claim 4, wherein it further comprises a third well region on the substrate; the first well region, the second well region, the first doping region and the second doping region are formed in the third well region; a doping concentration of the third well region is greater than a doping concentration of the substrate, doping concentrations of the first well region and the second well region are greater than the doping concentration of the third well region.

17. The anti-static metal oxide semiconductor field effect transistor structure according to claim 5, wherein it comprises two anti-static body structures, and the two anti-static body structures are symmetrical with respect to a centerline of the anti-static metal oxide semiconductor field effect transistor structure.

18. The anti-static metal oxide semiconductor field effect transistor structure according to claim 5, wherein the second lead-out region is further disposed on one side of the first well region away from the first doping region.

19. The anti-static metal oxide semiconductor field effect transistor structure according to claim 9, wherein the isolation structure is a shallow trench isolation structure.

20. The anti-static metal oxide semiconductor field effect transistor structure according to claim 9, wherein the isolation structure is a field oxide layer.

* * * * *